(12) United States Patent
Nishi et al.

(10) Patent No.: US 9,362,241 B2
(45) Date of Patent: Jun. 7, 2016

(54) MANUFACTURING METHOD FOR SEMICONDUCTOR DEVICES

(71) Applicant: Renesas Electronics Corporation, Koutou-ku, Tokyo (JP)

(72) Inventors: Takaomi Nishi, Tokyo (JP); Takehiko Saito, Tokyo (JP); Katsuhiro Torii, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/829,619

(22) Filed: Aug. 18, 2015

(65) Prior Publication Data

US 2016/0064343 A1    Mar. 3, 2016

(30) Foreign Application Priority Data

Aug. 28, 2014 (JP) ................. 2014-174648

(51) Int. Cl.
*H01L 21/44* (2006.01)
*H01L 23/00* (2006.01)
(Continued)

(52) U.S. Cl.
CPC .............. *H01L 24/03* (2013.01); *H01L 23/528* (2013.01); *H01L 23/53228* (2013.01);
(Continued)

(58) Field of Classification Search
CPC ........... H01L 2924/01079; H01L 2924/01327; H01L 2924/01024; H01L 2224/16; H01L 2224/73204; H01L 2224/0401; H01L 2224/05644; H01L 2224/13144; H01L 2224/05599; H01L 2224/11849; H01L 2224/29099; H01L 2224/45099; H01L 2224/05144; H01L 2224/05548; H01L 2224/48644; H01L 2224/73103; H01L 2224/81444; H01L 2224/03464; H01L 2224/13006; H01L 2224/04026; H01L 2224/11464; H01L 2224/1181; H01L 24/13; H01L 24/11; H01L 24/05; H01L 24/03; H01L 24/16; H01L 24/12; H01L 24/81; H01L 23/3114; H01L 23/49816; H05K 3/3489; H05K 3/181; H05K 3/3457; H05K 3/382; H05K 2203/043; H05K 2203/072; H05K 2203/0776; H05K 2203/1157; C23C 18/1651; C23C 18/16; C23C 18/1689; C23C 18/44; B23K 2201/40; B23K 2203/56
USPC .................. 438/614, 613, 652, 678, 459, 612
See application file for complete search history.

(56) References Cited

U.S. PATENT DOCUMENTS

| 2004/0000580 | A1* | 1/2004 | Lee ........................ B23K 1/008 228/220 |
| 2006/0209497 | A1* | 9/2006 | Ooi ..................... C23C 18/1651 361/600 |
| 2009/0230175 | A1* | 9/2009 | Kawashiro ........... B23K 1/0016 228/223 |

FOREIGN PATENT DOCUMENTS

JP    2005-044987 A    2/2005

*Primary Examiner* — Chuong A Luu
*Assistant Examiner* — Cory Eskridge
(74) *Attorney, Agent, or Firm* — Shapiro, Gabor and Rosenberger, PLLC

(57) ABSTRACT

A manufacturing method for semiconductor devices includes the steps of forming an Ni/Au film that includes an Ni film and an Au film formed over the Ni film over a wiring that is coupled to each of a plurality of electrode pads formed over a principal surface of a semiconductor wafer and arranges each of the electrode pads at a different position, grinding a back surface of the semiconductor wafer, performing reduction treatment on a surface of the Ni/Au film, and forming a solder bump over the Ni/Au film. In the reduction treatment, respective processes of flux application, reflow soldering and cleaning are performed and the solder bump is bonded to the Ni/Au film after the reduction treatment has been completed. Thereby, bonding reliability in flip chip bonding of a semiconductor device is improved.

12 Claims, 9 Drawing Sheets

(51) Int. Cl.
*H01L 23/528* (2006.01)
*H01L 23/532* (2006.01)
(52) U.S. Cl.
CPC ........ *H01L 24/11* (2013.01); *H01L 2224/0381* (2013.01); *H01L 2224/03464* (2013.01); *H01L 2224/03828* (2013.01); *H01L 2224/03849* (2013.01); *H01L 2224/0401* (2013.01); *H01L 2224/05082* (2013.01); *H01L 2224/05144* (2013.01); *H01L 2224/05155* (2013.01); *H01L 2224/1181* (2013.01); *H01L 2224/11849* (2013.01); *H01L 2924/01024* (2013.01)

MANUFACTURING METHOD FOR SEMICONDUCTOR DEVICES

CROSS-REFERENCE TO RELATED APPLICATIONS

The disclosure of Japanese Patent Application No. 2014-174648 filed on Aug. 28, 2014 including the specification, drawings and abstract is incorporated herein by reference in its entirety.

BACKGROUND

The present invention relates to a technology of manufacturing semiconductor devices, such as, for example, a wafer process package and so forth for performing bump bonding.

In assembly of the wafer process package (WPP, and also called WLP: Wafer Level Package), when bonding a solder bump to an electrode that is configured by part of a relocation wiring, an oxide film on a surface of the electrode is removed.

Thus, in regard to removal of the oxide film when forming the bump (a conductive bump), a description is made, for example, in Japanese Unexamined Patent Publication No. 2005-44987. In Japanese Unexamined Patent Publication No. 2005-44987, there is disclosed a technology of applying a plurality of times a flux that various components are included and compounding ratios of the components are made different from one another onto a UBM (Under Bump Metal) layer of a substrate and removing an oxide film on a surface of each of the UBM layer and a conductive ball.

In the above-mentioned wafer process package, an electroless Au-plated film is formed over the surface of the electrode formed by the relocation wiring in order to prevent a Ni film from being oxidized. However, since the electroless Au-plated film is coarsely formed, oxygen intrudes into the package through a gap in the Au-plated film, the surface of the Ni film is oxidized and the growth of a Sn—Ni—Cu alloy layer (a reaction layer) is inhibited when forming the solder bump. As a result, it is feared that defective solder bonding may occur. In addition, it is feared that cracks may be generated in flip chip bonding.

SUMMARY

Incidentally, use of Au plating to the electrode is not described in Japanese Unexamined Patent Publication No. 2005-44987.

Other subjects and novel features will become apparent from description of the present specification and the appended drawings.

According to one embodiment of the present invention, there is provided a manufacturing method for semiconductor devices, including the steps of (a) forming an Ni/Au film that includes an Ni film and an Au film formed over the Ni film over a wiring that is coupled to each of a plurality of electrode pads formed over a principal surface of a semiconductor wafer and arranges each of the electrode pads at a different position, (b) performing reduction treatment on a surface of the Ni/Au film and (c) forming a solder bump over the Ni/Au film.

According to the above-mentioned one embodiment, it is possible to improve bonding reliability in flip chip bonding of a semiconductor device.

DETAILED DESCRIPTION

In the following embodiments, description on the same or similar parts is not repeated in principle unless otherwise necessary.

Further, although, in the following embodiments, description will be made by dividing into a plurality of sections or embodiments when necessary for the convenience sake, these are not unrelated to each another and these are related to each other such that one covers some or all of modified examples, details, supplemental explanation and so forth of the other unless otherwise clearly stated.

In addition, in the following embodiments, in a case where the number of constitutional elements and so forth (the number of units, a numerical value, an amount, a range and so forth are included) is referred to, it is not limited to the specific number, and may be at least and/or not more than the specific number unless otherwise clearly stated and unless otherwise definitely limited to the specific number in principle.

In addition, in the following embodiments, it goes without saying that the constitutional element (an element step and so forth are also included) is not necessarily unavoidable unless otherwise clearly stated and unless otherwise thought to be clearly unavoidable in principle.

In addition, in the following embodiments, it goes without saying that when saying that "it is included from A", "it includes A", "it has A", "it includes A" and so forth in regard to the constitutional element and so forth, they do not exclude elements other than the above unless otherwise clearly stated, in particular, that it means that element alone. Likewise, in the following embodiments, when the shapes of the constitutional elements and so forth, a positional relationship among them and so forth are referred to, the ones that are substantially approximate or similar to the shapes and so forth will be included unless otherwise clearly stated and unless otherwise clearly thought that it is not so in principle. The same also applies to the above-mentioned numerical value and range.

In the following, the embodiments of the present invention will be described in detail on the basis of the drawings. Incidentally, in all of the drawings depicted in order to describe the embodiments, the same numerals are assigned to members having the same functions and repetitive description thereof is omitted. In addition, for easy understanding of the drawings, there are cases where hatching is applied even to a plan view.

First Embodiment

Figure 1:
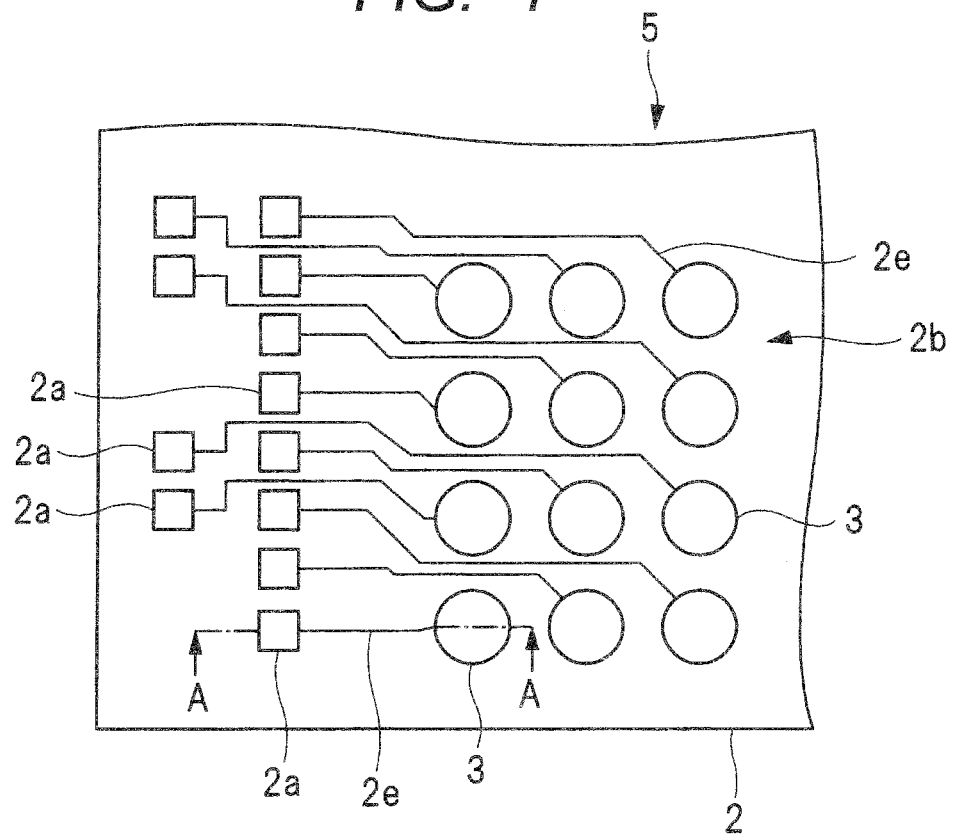
FIG. 1 is a partial plan view illustrating one example of a structure of main parts of a semiconductor device manufactured by a manufacturing method for semiconductor devices according to an First Embodiment.
Figure 2:
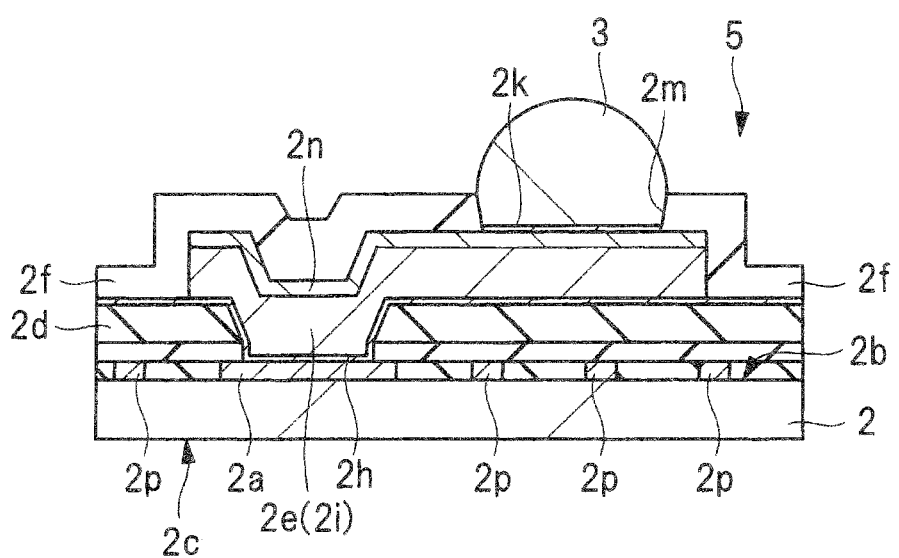
FIG. 2 is a partial sectional diagram illustrating one example of the structure that has been cut along the A-A line in FIG. 1.

FIG. 1 is a partial plan view illustrating one example of a structure of main parts of a semiconductor device manufactured by a manufacturing method for semiconductor devices according to an First Embodiment, and FIG. 2 is a partial sectional diagram illustrating one example of the structure that has been cut along the A-A line in FIG. 1.
<Semiconductor Device>

The semiconductor device manufactured by the manufacturing method according to the First Embodiment and illustrated in FIG. 1 is a wafer process package 5 and is the semiconductor package of a small size that is almost the same as the size of a chip.

A configuration of the wafer process package 5 manufactured by the manufacturing method according to the First Embodiment will be described by using FIG. 1 and FIG. 2. The wafer process package 5 includes a semiconductor chip 2 that includes a principal surface 2b, a back surface 2c that is opposite to the principal surface 2b, a plurality of electrode pads formed over the principal surface 2b, a relocation wiring (a wiring) 2e that is coupled to each of the plurality of electrode pads 2a and arranges each of the plurality of electrode pads 2a at a different position and a polyimide layer 2f that is an insulating film formed over the relocation wiring 2e.

Further, the wafer process package 5 includes a plurality of solder bumps (projected electrodes) 3 each of which is bonded to an Au (gold) film 2k that is formed over a partial upper part of the relocation wiring 2e and the plurality of solder bumps 3 serve as external terminals of the wafer process package 5.

That is, in the semiconductor chip 2 that the wafer process package 5 includes, the plurality of electrode pads 2a that are provided over the principal surface 2b of the semiconductor chip 2 and the solder bumps 3 that are provided over the relocation wirings 2e via the Au films 2k are electrically coupled together via the relocation wirings 2e.

Thereby, an installation pitch of the plurality of electrode pads 2a provided over the principal surface 2b of the semiconductor chip 2 is widened by the relocation wirings 2e and each of the plurality of solder bumps 3 is bonded to a new electrode (a region of the Au film 2k) provided over each relocation wiring 2e.

Incidentally, the relocation wiring 2e is also called a rewiring.

In addition, each of the plurality of electrode pads 2a is made of, for example, Al (aluminum) and so forth. Then, the relocation wiring 2e is a wiring that includes, for example, Cu (copper) as a principal component, an Ni (nickel) film 2n is formed over its upper layer and a laminated film 2h that includes a Cr (chromium) film serving as a barrier layer and a Cu film serving as a seed layer is formed over its lower layer.

In the present embodiment, for simplicity of description, the laminated film is indicated as the seed layer 2h. Therefore, the relocation wiring 2e may be also regarded as the wiring having a structure that includes the seed layer 2h, a Cu film 2j and the Ni film 2n and, in this case, the seed layer 2h, the Cu film 2i and the Ni film 2n are arranged in order from the lower layer side toward the upper layer side.

Then, in the relocation wiring 2e, the seed layer 2h formed over its lower layer is bonded with the electrode pad 2a and the Ni film 2n formed over its upper layer is bonded with the solder bump 3 via the Au film 2k.

Incidentally, each of the plurality of solder bumps 3 is arranged in each of a plurality of openings 2m in the polyimide layers 2f respectively formed over the relocation wirings 2e. That is, the Au film 2k is formed in each of the plurality of openings 2m in the polyimide layers 2f formed over the relocation wirings 2e. When having an eye on a region of the opening 2m, a Ni/Au film that includes the Ni film 2n and the Au film 2k formed over the Ni film 2n is formed over the relocation wiring 2e and the Au film 2k is exposed into the opening 2m.

In addition, the Au film 2k that is plated with Au is formed over the Ni film 2n for the purpose of preventing the Ni film 2n from being oxidized and of ensuring solder wettability (improving bonding property of the solder bump 3).

Then, as illustrated in FIG. 2, a plurality of wiring patterns 2p are formed in a wiring layer that is the same as the layer that the electrode pads 2a of the semiconductor ship 2 are provided.

In addition, in the wafer process package 5, the solder bumps 3 that serve as the plurality of external terminals are arrayed in the form of a grid as illustrated in FIG. 1 on the principal surface 2b side of the semiconductor chip 2 and the arrangement of the solder bumps 3 is the same as that of BGA (Ball Grid Array) in external appearance.

In addition, as described above, in the wafer process package 5 illustrated in FIG. 2, the relocation wiring 2e is further coupled to the electrode pad 2a that has been formed over the principal surface 2b of the semiconductor chip 2 and the solder bump 3 is coupled to the relocation wiring 2e via the Au film 2k. That is, the wafer process package 5 is of the type that the arrangement pitch of the electrode pads 2a has been narrowed. Since pitch narrowing makes it difficult to mount the solder bump 3 that is the external terminal directly onto the electrode pad 2a, the solder bump 3 is coupled to the relocation wiring 2e by widening the pitch by the relocation wiring 2e so as to allow mounting of the solder bump 3.

Thereby, it becomes possible to arrange the plurality of solder bumps 3 in the form of a grid.
<Manufacturing Method for Semiconductor Devices>

Next, a manufacturing method for semiconductor devices according to the present embodiment will be described. Each of FIG. 3 and FIG. 4 is a flow chart and sectional diagrams illustrating one example of a part of the manufacturing method for semiconductor devices according to the First Embodiment.

Figure 3:
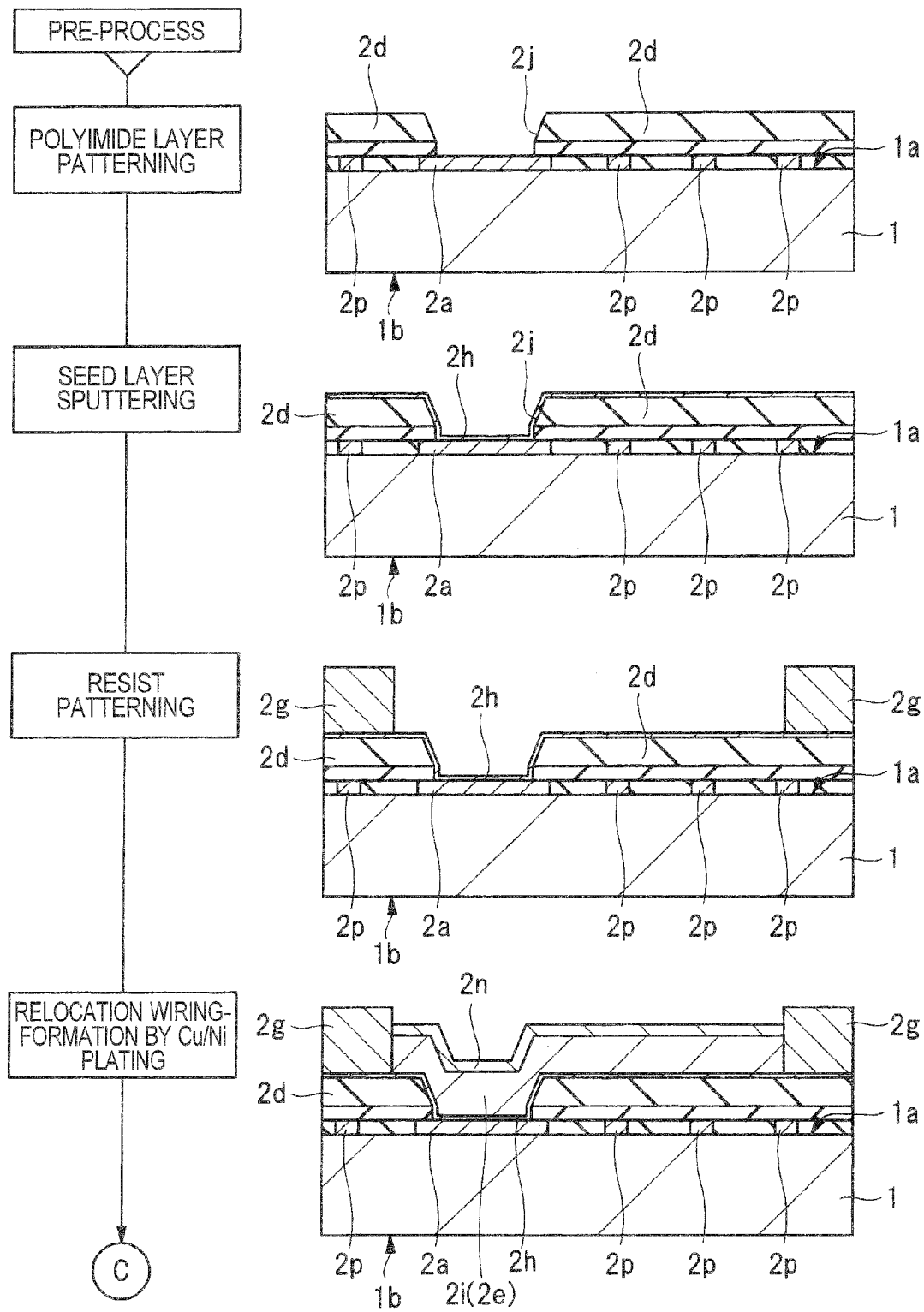
FIG. 3 is a flow chart and sectional diagrams illustrating one example of a part of the manufacturing method for semiconductor devices according to the First Embodiment.
Figure 4:
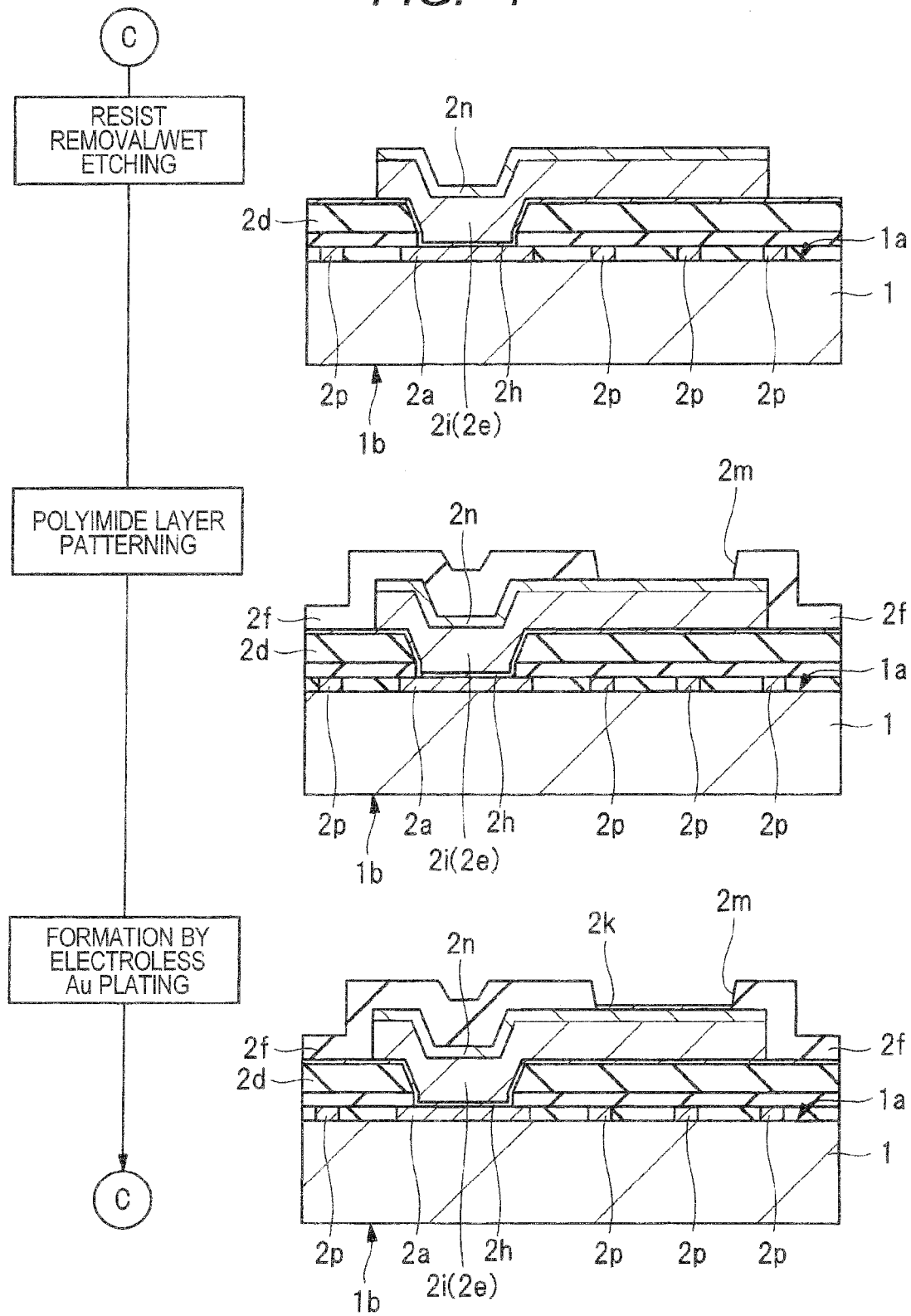
FIG. 4 is a flow chart and sectional diagrams illustrating one example of a part of the manufacturing method for semiconductor devices according to the First Embodiment.

First, "Polyimide Layer Patterning" illustrated in FIG. 3 is performed. In the polyimide layer patterning, a polyimide layer 2d is formed over a principal surface 1a of a semiconductor wafer 1, and then an upper part of the electrode pad 2a is opened by patterning. Thereby, it becomes possible to expose the electrode pad 2a into an opening 2j in the polyimide layer 2d. Incidentally, the electrode pad 2a is made of, for example, Al and so forth.

After the polyimide layer patterning has been completed, "Seed Layer Sputtering" illustrated in FIG. 3 is performed. In the seed layer sputtering, the seed layer 2h is formed (deposited) by sputtering over the polyimide layer 2d and the electrode pad 2a. Thereby, the electrode pad 2a that is made of Al and so forth and the seed layer 2h are electrically coupled together. In formation of the seed layer 2h, first, the Cr film is formed as the barrier layer and the Cu film is formed over the Cr film as the seed layer. In the present embodiment, for simplicity of description, the laminated film that includes the Cr film and the Cu film is noted as the seed layer 2h. Incidentally, in the seed layer 2h, the barrier layer may be configured by either of the above-mentioned Cr film and a film made of, for example, titanium and so forth.

After the seed layer sputtering has been completed, "Resist Patterning" illustrated in FIG. 3 is performed. In the resist patterning, a portion for the relocation wiring 2e to be formed in a later process is left as it is and a region other than that portion is covered with a resist 2g.

After the resist patterning has been completed, "Relocation Wiring—Formation by Cu/Ni Plating" illustrated in FIG. 3 is performed. In the relocation wiring—formation by Cu/Ni plating, first, the Cu film is formed by electroplating and then the Ni film is formed by electroplating.

Describing in detail, first, the Cu film 2i formed by electroplating over the seed layer 2h in a region surrounded by the resist 2g. Thereby, the relocation wiring (the Cu film 2i) 2e that includes Cu as the principal component is formed over the seed layer 2h. Then, the Ni film 2n is formed over the surface of the relocation wiring 2e by electroplating. Thereby, the seed layer 2h, the relocation wiring 2e (the Cu film 2i) and the Ni film 2n are formed.

After the relocation wiring—formation by Cu/Ni plating has been completed, "Resist Removal/Wet Etching" illustrated in FIG. 4 is performed. In the resist removal/wet etching, the resist 2g that surrounds the relocation wiring 2e is removed by the wet-etching.

After the resist removal/wet etching has been completed, "Polyimide Layer Patterning" illustrated in FIG. 4 is performed. In the polyimide layer patterning, the polyimide layer 2f is formed over the relocation wiring 2e and the partial upper part of the relocation wiring 2e is opened by patterning. Thereby, the opening 2m is formed in the polyimide layer 2f and part of the Ni film 2n formed over the relocation wiring 2e is exposed into the opening 2m. That is, a state where the Ni film 2n that configures the upper layer film of the relocation wiring 2e is exposed into the opening 2m is obtained.

After the polyimide layer patterning has been completed, "Formation by Electroless Au Plating" illustrated in FIG. 4 is performed. In the formation by electroless Au plating, the Au film 2k is formed over the Ni film 2n that is exposed into the opening 2m in the polyimide layer 2f by electroless Au plating. Thereby, the Au film 2k (the Ni/Au film) formed over the relocation wiring 2e is exposed into the opening 2m in the polyimide layer 2f.

Incidentally, the Au film 2k is formed for the purpose of preventing the Ni film 2n that configures the lower layer from being oxidized and of ensuring solder wettability (improving the bonding property of the solder bump 3).

In addition, in the First Embodiment, the Au film 2k is formed by electroless plating. Since use of electroless plating eliminates formation of a wiring for electric field in comparison with electroplating, it is possible to promote a reduction in cost for formation of the Au film 2k.

Incidentally, in the First Embodiment, as one example of the electroless plating, displacement plating is adopted. The displacement plating is of the type that metal ions in a solution are precipitated as a metal by utilizing a difference in ionization tendency between metals, and it is possible to promote a reduction in cost as described above by adopting the replacement plating.

Figure 5:
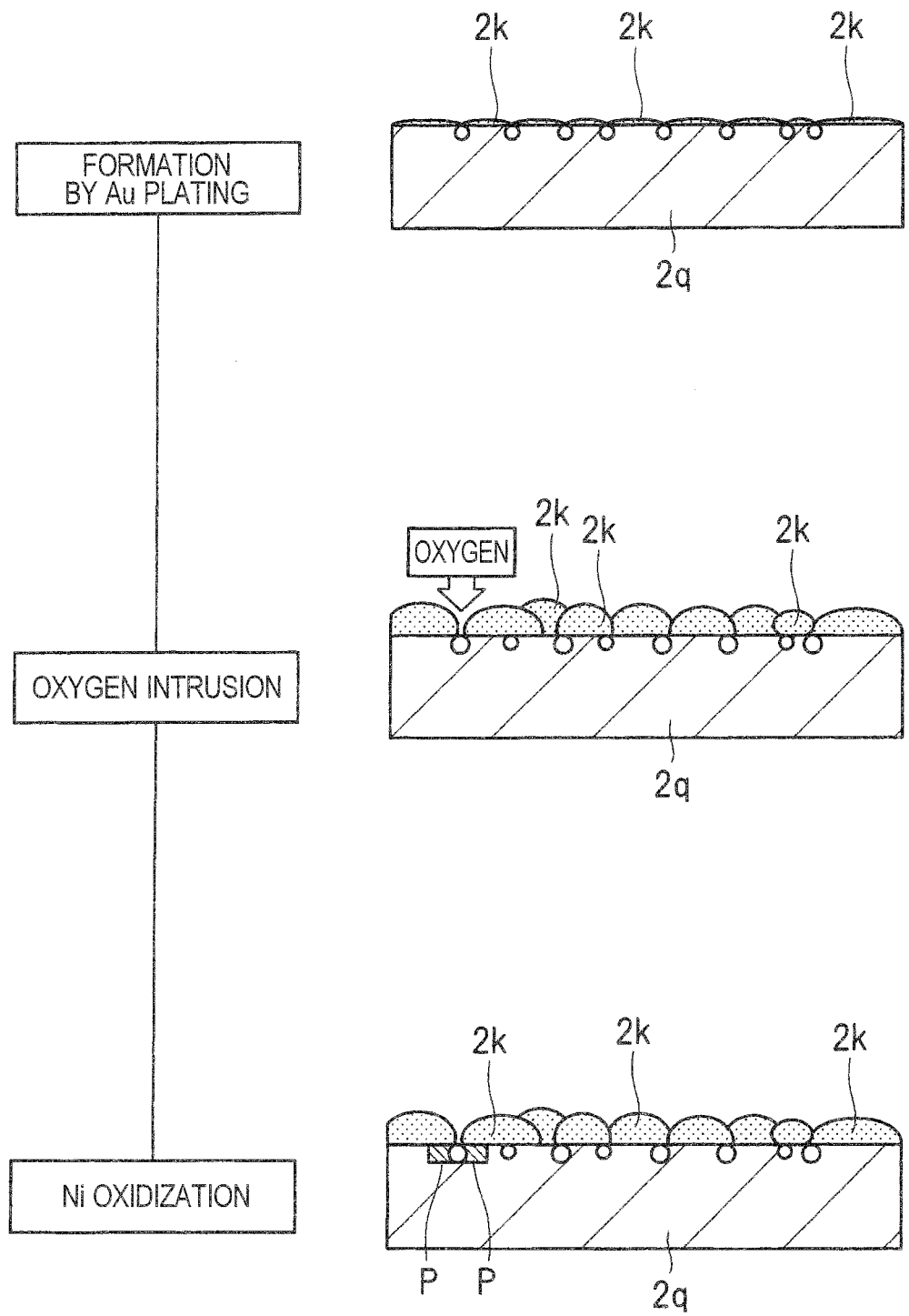
FIG. 5 is a flow chart and sectional diagrams illustrating one example of a manufacturing method according to a comparative example.

Here, disadvantages which would occur caused by Au plating performed on the relocation wiring 2e will be described. FIG. 5 is a flow chart and sectional diagrams illustrating one example of a manufacturing method according to a comparative example that has been examined in comparison with the present embodiment.

As illustrated in "Formation by Au Plating" in FIG. 5, the Au film 2k that is an Au-plated film is formed by electroless Au plating over a conductor 2q formed by Ni plating. In this case, in formation by elecrroless Au plating, in particular, by replacement Au plating, elution of a base material metal (Ni) occurs, and therefore formation of a "coarse" part on the base material metal (Ni) is unavoidable and Ni becomes liable to be oxidized.

That is, as illustrated in "Oxygen Intrusion" in FIG. 5, oxygen intrudes into the conductor 2q through the gap in the Au film 2k and a surface of the Ni film over the conductor 2q is oxidized (a Ni-oxidized part P in FIG. 5) as illustrated in "Ni Oxidization" in FIG. 5.

Then, when the solder bump 3 is formed over (bonded to) the Au film 2k in a later process, growth of a Sn—Ni—Cu alloy layer (a reaction layer) is inhibited, which consequently leads to a failure in solder bonding.

In addition, cracks are generated when bonding the semiconductor device to a flip chip via the solder bump 3.

Accordingly, in the First Embodiment, before the solder bump 3 is mounted over (formed over or bonded to) the Au film 2k (the Ni/Au film), an oxide and/or an oxide film formed over the Au film 2k is removed by performing later described bump mounting pretreatment (reduction treatment).

Figure 6:
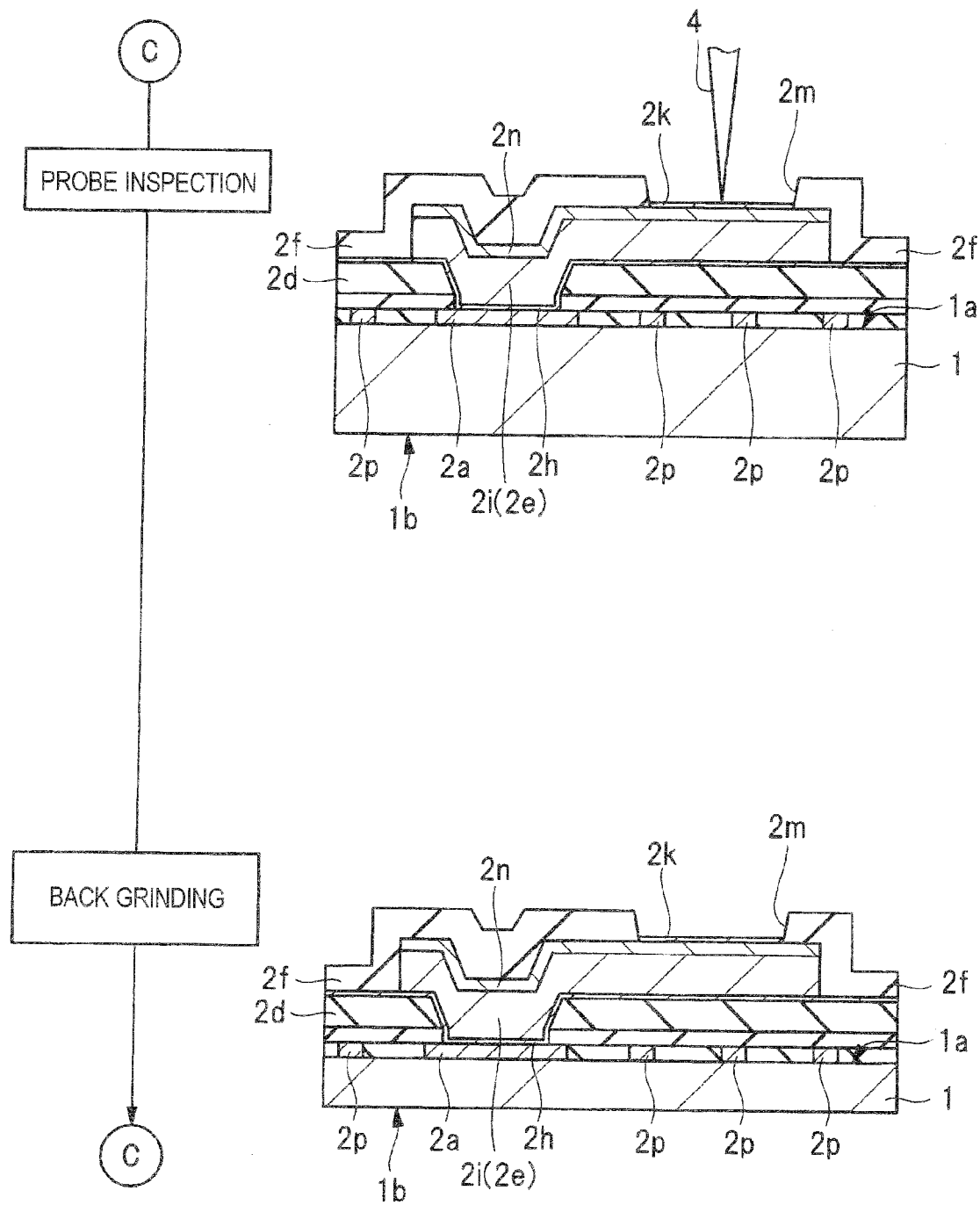
FIG. 6 is a flow chart and sectional diagrams illustrating one example of a part of the manufacturing method for semiconductor devices according to the First Embodiment.
Figure 7:
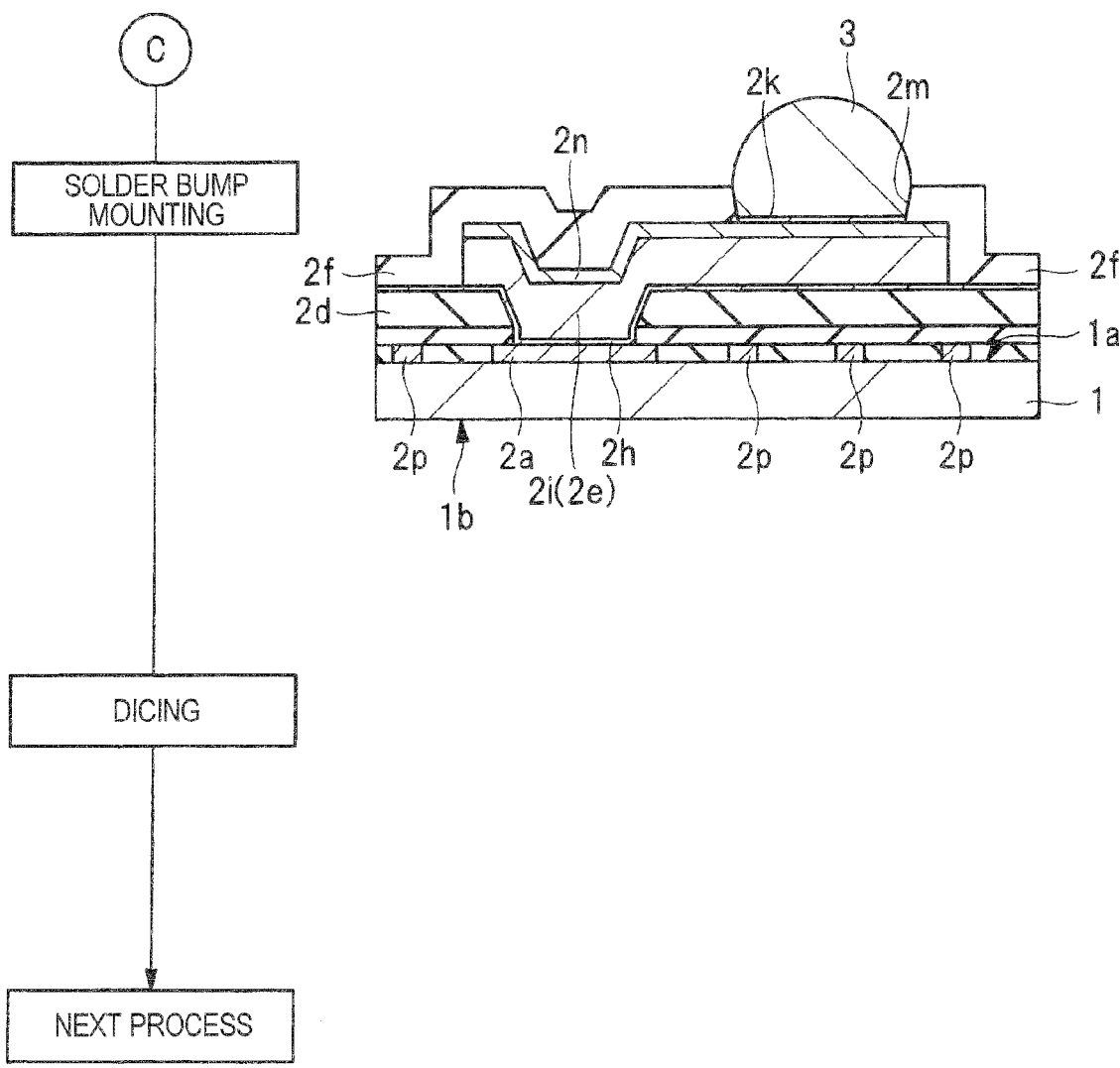
FIG. 7 is a flow chart and a sectional diagram illustrating one example of a part of the manufacturing method for semiconductor devices according to the First Embodiment.

Next, after the formation by electroless Au plating has been completed, "Probe Inspection" illustrated in FIG. 6 is performed. FIG. 6 is a flow chart and sectional diagrams illustrating one example of a part of the manufacturing method for semiconductor devices according to the First Embodiment, and FIG. 7 is a flow chart and a sectional diagram illustrating one example of a part of the manufacturing method for semiconductor devices according to the First Embodiment.

In the probe inspection, a probe 4 is brought into contact with the Au film 2k over the relocation wiring 2e and electric inspection is performed in this state.

After the probe inspection has been performed, "Back Grinding" illustrated in FIG. 6 is performed. In the back grinding, aback surface 1b that is opposite to the principal surface 1a of the semiconductor wafer 1 is ground to reduce the thickness of the semiconductor wafer 1. That is, before forming the solder bump 3 over the Au film 2k, the back surface 1b of the semiconductor wafer 1 is ground to thin the semiconductor wafer 1.

Incidentally, when the back grinding is performed before forming the solder bump 3, since the solder bump 3 is not yet attached to the principal surface 1a of the semiconductor wafer 1, and thus the principal surface 1a of the semiconductor wafer 1 is in a flat state and the principal surface 1a side serves as the side that holds the semiconductor wafer 1 in the back grinding, the semiconductor wafer 1 is held and ground with ease when the principal surface 1a is made flat. Therefore, it is also possible to increase grinding accuracy.

Further, it is easier to stick and remove a not illustrated tape for back grinding (hereinafter, also referred to as a BG tape) in a case where the solder bump 3 is not attached to the principal surface 1a of the semiconductor wafer 1 than other cases. That is, it is possible to facilitate scraping of the semiconductor wafer 1 and to increase the grinding accuracy by performing the back grinding before forming the solder bump 3. Further, it is possible to facilitate sticking and removal of the tape for back grinding.

After the back grinding has been completed, "Solder Bump Mounting" illustrated in FIG. 7 is performed. In that occasion, in the First Embodiment, after the back grinding has been performed and before the solder bump mounting is performed, reduction treatment is performed on the surface of the Au film 2k (the Ni/Au film) over the relocation wiring 2e. Incidentally, hereinafter, the reduction treatment will be also referred to as bump mounting pretreatment or flux reflow soldering pretreatment.

Figure 8:
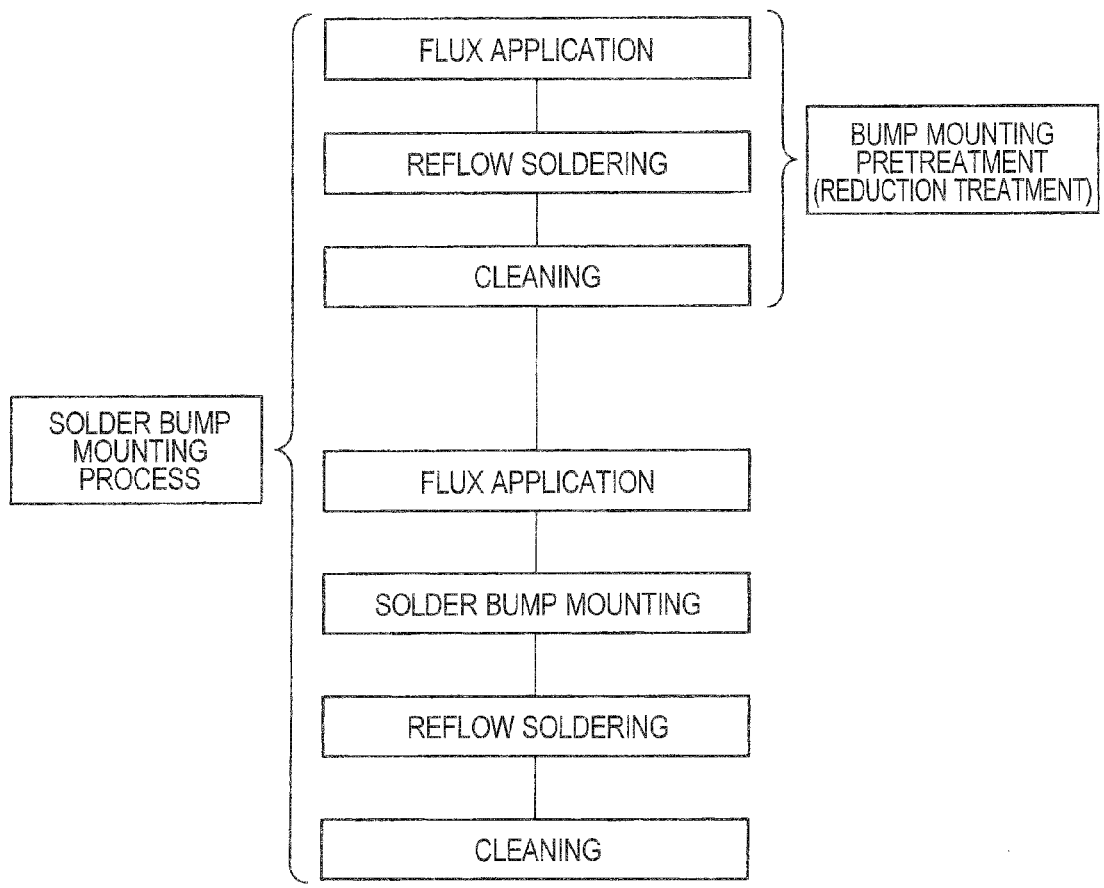
FIG. 8 is a flow chart illustrating one example of procedures of bump mounting pretreatment in the manufacturing method for semiconductor devices according to the First Embodiment.
Figure 9:
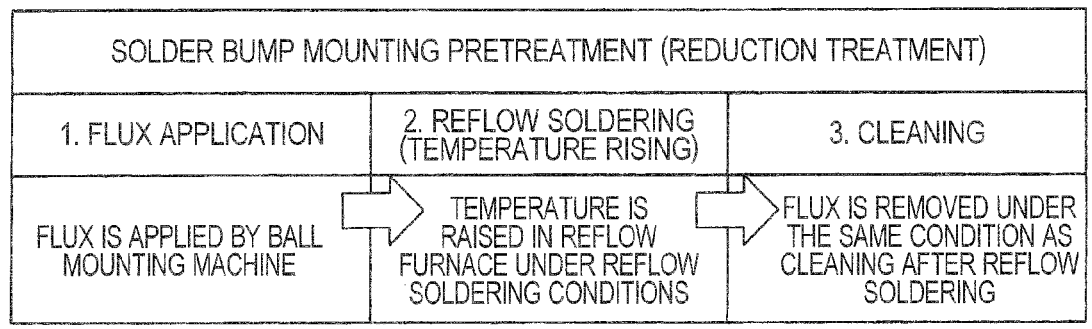
FIG. 9 is a treatment condition chart illustrating one example of the bump mounting pretreatment illustrated in FIG. 8.
Figure 10:
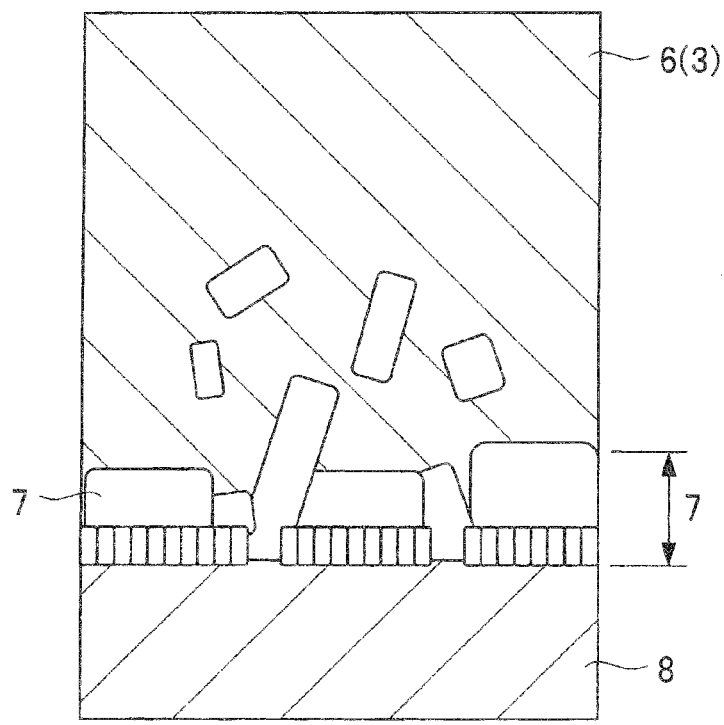
FIG. 10 is a sectional diagram illustrating one example of an advantageous effect brought about by the bump mounting pretreatment in the manufacturing method for semiconductor devices according to the First Embodiment.

Here, the reduction treatment (the bump mounting pretreatment or the flux reflow soldering pretreatment) of the First Embodiment will be described. FIG. 8 is a flowchart illustrating one example of procedures of the bump mounting pretreatment in the manufacturing method for semiconductor devices according to the First Embodiment, FIG. 9 is a treatment condition chart illustrating one example of the bump mounting pretreatment illustrated in FIG. 8, and FIG. 10 is a sectional diagram illustrating one example of an advantageous effect brought about by the bump mounting pretreatment in the manufacturing method for semiconductor devices according to the First Embodiment.

As illustrated in FIG. 8, the reduction treatment (the bump mounting pretreatment) includes three processes of flux application (application of a flux constituent material), reflow soldering and cleaning.

First, the flux application will be described.

Incidentally, as the flux constituent material used in the reduction treatment, the material that is the same as the flux material to be applied to the Au film 2k after the reduction treatment has been performed and before the solder bump 3 is formed (mounted) is used.

By using the material that is the same as the flux material to be applied to the Au film 2k after the reduction treatment has been performed as the flux constituent material used in the reduction treatment in the First Embodiment as described above, it is possible to shape a device for use in flux application. In addition, it is also possible to share the flux material itself. Further, it is possible to perform the reduction treatment without changing a method for flux treatment by using the same flux material.

Here, the flux constituent material used in the reduction treatment will be described. The flux constituent material is configured by, for example, rosin, a solvent, a thixotropic agent, a halogenated activator, an auxiliary activator, an organic acid and so forth. That is, the flux constituent material is a rosin-based flux.

However, as the flux constituent material, a water-soluble flux that dissolves in water may be used, not limited to the rosin-based flux, and in this case, the same water-soluble flux is used as the flux material to be applied to the Au film 2k after the reduction treatment has been performed and before the solder bump 3 is formed (mounted).

Incidentally, the rosin-based flux has such a characteristic that it does not get dry easily. Further, a margin is large in wetting up of the solder. Therefore, it is also possible to cope with a product of high quality such as an on-vehicle semiconductor device (the wafer process package 5) and so forth by using the rosin-based flux.

On the other hand, since the water-soluble flux is low in viscosity, it is possible to apply the water-soluble flux also by a spin coating method. Therefore, it is possible to promote a reduction in cost for cleaning treatment by using the water-soluble flux.

Then, the flux constituent material is applied onto the surface of the Au film 2k over the relocation wiring 2e by the flux application in the reduction treatment. In the flux application, the flux is applied to a desired portion by a ball mounting machine as indicated by "Flux Application" in FIG. 9.

For example, a mask that is opened to a position on the Au film 2k formed over the relocation wiring 2e is used to apply the flux to a portion (the Au film 2k) to which the flux is to be applied through the opening so opened in the mask. Since it is difficult to remove the rosin-based flux and disadvantages such as corrosion, leakage and so forth would possibly occur when the flux is adhered to a portion other than the Au film 2k, it is preferable to apply the flux with care such that the flux is not adhered to the portion other than the desirable portion.

On the other hand, the water-soluble flux is easily soluble in water and is removed with ease. Therefore, when applying the water-soluble flux, it is possible to apply the flux highly efficiently by applying the flux to the entire surface of the semiconductor wafer 1 by the spin-coating method.

After the flux application in the reduction treatment has been completed, "Reflow Soldering" in "Reduction Treatment" ("Bump Mounting Pretreatment") in FIG. 8 is performed. In the reflow soldering, as indicated in "Reflow Soldering (Temperature Rising)" in FIG. 9, the temperature is raised in a reflow furnace under reflow soldering conditions. For example, the flux is heated for several minutes at a temperature from about 200° C. to about 300° C. that are solder melting temperatures (solder activation temperatures).

Thereby, the activator in the flux constituent material is heated to make it possible to remove the oxide and/or the oxide film over the surface of the Au film 2k formed over the relocation wiring 2e.

After the reflow soldering in the reduction treatment has been completed, "Cleaning" in "Reduction Treatment (Bump Mounting Pretreatment)" in FIG. 8 is performed. In the cleaning, as indicated by "Cleaning" in FIG. 9, the flux is removed under the same conditions as those in post-cleaning of reflow soldering that comes after the solder bump mounting.

Specifically, the flux material is washed out by spraying a surfactant to the semiconductor wafer 1 while rotating the semiconductor wafer 1 by spin cleaning. However, the cleaning is not limited to spin cleaning and may be of the type that the semiconductor wafer 1 is cleaned in a state of being soaked in a liquid tank that contains the surfactant.

Then, after the cleaning with the surfactant has been completed, it is possible to wash out the flux material by spraying pure water (spin cleaning) to the semiconductor wafer 1. However, also the cleaning with pure water is not limited to the spin cleaning and the flux material may be washed out by cleaning the semiconductor wafer 1 in a state of being soaked in the liquid tank.

Form the above, the reduction treatment of the manufacturing method according to the First Embodiment is completed.

Thereby, it is possible to remove the oxide and/or the oxide film formed over the surface of the Au film 2k formed over the relocation wiring 2e. That is, it is possible to remove the oxide and/or the oxide film formed over the surface of the Au film 2k by performing the reduction treatment (the bump mounting pretreatment) that includes the flux application, the reflow soldering (the temperature rising) and the cleaning on the Au film 2k.

After the reduction treatment has been completed, flux application that comes after the reduction treatment (the bump mounting pretreatment) indicated in FIG. 8 is performed. Here, the flux application that comes after the reduction treatment is performed on the Au film 2k over the relocation wiring 2e that the oxide and/or the oxide film have/has been removed by the reduction treatment.

In the flux application that comes after the reduction treatment, the flux is applied to the Au film 2k over the relocation wiring 2e by using the flux material (the flux constituent material) that is the same as that in the flux treatment performed in the reduction treatment and by the same method.

The rosin-based flux material that is configured by, for example, the rosin, the solvent, the thixotropic agent, the halogenated activator, the auxiliary activator, the organic acid and so forth is used, and the flux material is applied to the surface of the Au film 2k. In that occasion, as in the case in the reduction treatment, the flux is applied to the desired portion by the ball mounting machine.

For example, the mask that is opened to the position on the Au film 2k formed over the relocation wiring 2e is used to apply the flux to the portion (the Au film 2k) to which the flux is to be applied through the opening so opened. Since it is difficult to remove the rosin-based flux and the disadvantages such as the corrosion, the leakage and so forth would possibly occur when the flux is adhered to the portion other than the Au film 2k, the flux is applied with care such that the flux is not adhered to the portion other than the desirable portion.

However, in a case where the water-soluble flux has been used in the reduction treatment, the water-soluble flux is also used in the flux application that comes after the reduction treatment.

Incidentally, the flux application that comes after the reduction treatment is performed for the purpose of temporarily attaching the solder bump 3 when mounting the solder bump 3 and removing the oxides and/or the oxide films formed over the surfaces of both of the Au film 2k and the solder bump 3. That is, temporal attachment of the solder bump 3 is performed in order to retain the solder bump 3 that has been arranged over the Au film 2k for a while until reflow soldering is performed in a later solder bump mounting process. In addition, the oxide and/or the oxide film over the surface of the solder bump 3 are/is removed by washing the surface of the solder bump 3 while rotating the solder bump 3 in reflow soldering.

After the flux application that comes after the reduction treatment has been completed, solder bump mounting is performed. That is, the solder bump 3 is formed over the Au film 2k over the relocation wiring 2e. In the solder bump mounting, the solder bump 3 is mounted onto each of a predetermined plurality of the Au films 2k by using the ball mounting machine.

After the solder bump mounting has been completed, reflow soldering that comes after the reduction treatment is performed. In the reflow soldering, the temperature of the solder bump 3 is raised in the reflow furnace under the reflow soldering conditions. For example, the solder bump 3 is heated at the temperature from about 200° C. to about 300° C. that are the solder melting temperatures (the solder activation temperatures).

Thereby, the activator in the flux material is heated to make it possible to remove the oxide and/or the oxide film formed over the surface of the Au film 2k. Further, as mentioned above, it is also possible to remove the oxide and/or the oxide film over the surface of the solder bump 3 by rotating the solder bump 3.

After the reflow soldering for mounting the solder bump 3 has been completed, "Cleaning" that comes after "Reduction Treatment" in FIG. 8 is performed. In the cleaning, as one example, the flux material is washed out by spraying the surfactant to the semiconductor wafer 1 while rotating the semiconductor wafer 1. However, as in the case in the reduction treatment, cleaning is not limited to spin cleaning and may be of the type that the flux material is washed out by soaking the semiconductor wafer 1 in the liquid tank that contains the surfactant.

Then, after the semiconductor wafer 1 has been cleaned with the surfactant, the flux material is washed out by spraying pure water (spin cleaning) to the semiconductor wafer 1. However, the flux material may be washed out by cleaning the semiconductor wafer 1 in a state of being soaked in the liquid tank also in cleaning with pure water, not limited to spin cleaning.

From the above, the solder bump mounting illustrated in FIG. 7 is completed.

After the solder bump mounting has been completed, "Dicing" illustrated in FIG. 7 is performed to cut out the respective semiconductor chips 2 from the semiconductor wafer 1.

Then, fragmentation is performed by dicing and assembling of the wafer process package 5 illustrated in FIG. 1 is completed.

According to the manufacturing method for the semiconductor device according to the First Embodiment, before the solder bump 3 is bonded to (formed over) the Au film 2k over the relocation wiring 2e, it is possible to remove the oxide and/or the oxide film formed over the surface of the Au film 2k by performing the reduction treatment (the bump mounting pretreatment), the flux application, the reflow soldering (temperature rising), the cleaning and so forth on the surface of the Au film 2k.

Thereby, it becomes possible to promote the growth of a solder-bonded interface (the Sn—Ni—Cu alloy layer (the reaction layer 7 in FIG. 10)) when the solder bump is to be bonded to the surface of the Au film 2k and it becomes possible to suppress generation of cracks which would generate in flip chip bonding.

Here, FIG. 10 is a diagram illustrating one example of a structure of the bonded interface of the solder bump 3 in a case where the wafer process package 5 that is illustrated in FIG. 1 and on which the reduction treatment has been performed has been flip-chip mounted onto a mounted substrate and so forth, illustrating a state where a reaction layer 7 that is an Sn—Ni—Cu alloy layer formed between an Ni layer 8 and a solder layer 6 grows with continuity and thereby the growth is promoted and the reaction layer 7 is formed thick.

Therefore, it is possible to suppress generation of the cracks in flip-chip bonding.

As a result, it is possible to improve the bonding reliability in flip-chip bonding of the wafer process package 5.

Second Embodiment

Figure 11:
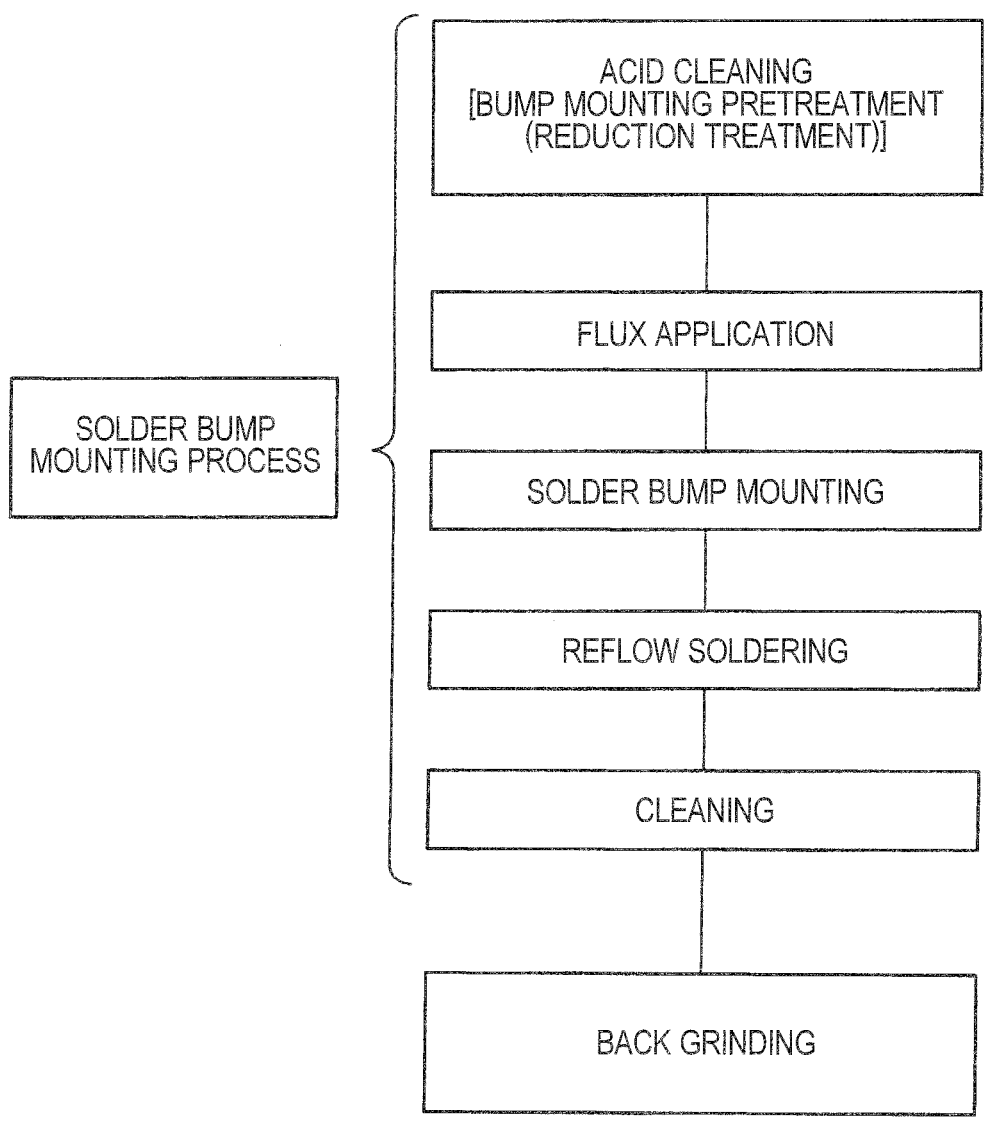
FIG. 11 is a flow chart illustrating one example of procedures of bump mounting pretreatment in a manufacturing method for semiconductor devices according to an Second Embodiment.

FIG. 11 is a flow chart illustrating one example of procedures of bump mounting pretreatment in a manufacturing method for semiconductor devices according to an Second Embodiment.

In the Second Embodiment, as the bump mounting pretreatment (the reduction treatment), "Acid Cleaning" is performed as indicated in FIG. 11. That is, cleaning (acid cleaning) using an acid is performed for the purposes of removing the oxide and/or the oxide film formed over the surface of the Au film. 2k that has been formed over the relocation wiring 2e.

Specifically, after the probe inspection illustrated in FIG. 6 has been performed, the back grinding is not performed and the solder bump mounting illustrated in FIG. 7 is performed. That is, in the Second Embodiment, before performing the back grinding, the acid cleaning illustrated in FIG. 11 is performed. Then, the back grinding is performed after the acid cleaning that is the reduction treatment and the solder bump mounting have been completed.

In the acid cleaning, although it is preferable to perform the cleaning by using an acid such as, for example, hydrochloric acid (HCl), sulfuric acid ($H_2SO_4$) and so forth, the acid to be used is not limited to these acids. Then, the semiconductor wafer 1 that has been subjected to the probe inspection is soaked in the liquid tank and so forth that a solution (a liquid medicine) such as, for example, hydrochloric acid, sulfuric acid and so forth is contained and then is immersed in a rinsing tank that pure water and so forth are contained to wash out the liquid medicine.

Here, since hydrochloric acid, sulfuric acid and so forth are handled as cleaning solutions, it is more preferable to adopt a cleaning method that the semiconductor wafer 1 is immersed in the liquid tank and so forth than adoption of the spin coating method and adoption of the above-mentioned cleaning method makes it possible for a worker to do work more safely.

Form the above, the acid cleaning is completed.

Thereby, it is possible to clean the surface of the Au film 2k over the relocation wiring 2e and it is possible to remove the oxide and/or the oxide film formed over the surface of the Au film 2k.

After the acid cleaning has been completed, "Flux Application" that comes after "Bump Mounting Pretreatment (Reduction Treatment)" illustrated in FIG. 11 is performed. Here, similarly to the First Embodiment, "Flux Application" is performed on the Au film 2k over the relocation wiring 2e from which the oxide and/or the oxide film have/has been removed by the acid cleaning (the reduction treatment).

In the flux application, the flux is applied to the Au film. 2k over the relocation wiring 2e by using the flux material (the flux constituent material) that is the same as that in the First Embodiment and by using the same method as that in the First Embodiment.

The rosin-based flux material that is configured by, for example, the rosin, the solvent, the thixotropic agent, the halogenated activator, the auxiliary activator, the organic acid and so forth is used, and the flux material is applied to the surface of the Au film 2k. In that occasion, similarly to the First Embodiment, the flux is applied to the desired portion, for example, by the ball mounting machine.

That is, also in the Second Embodiment, the mask that is opened to the position on the Au film 2k formed over the relocation wiring 2e is used to apply the flux to the portion (the Au film 2k) to which the flux is to be applied through the opening so opened. Since it is difficult to remove the rosin-based flux and the disadvantages such as the corrosion, the leakage and so forth would possibly occur when the flux is adhered to the portion other than the Au film 2k, the flux is applied with care such that the flux is not adhered to the portion other than the desirable portion.

Incidentally, the flux is applied for the purpose of temporarily attaching the solder bump 3 when mounting the solder bump 3 and removing the oxides and/or the oxide films formed over the surfaces of both of the Au film 2k and the solder bump 3. That is, temporal attachment of the solder bump 3 is performed in order to retain the solder bump 3 that has been arranged over the Au film 2k for a while until reflow soldering is performed in the later solder bump mounting process. In addition, the oxide and/or the oxide film formed over the surface of the solder bump 3 are/is removed by washing the surface of the solder bump 3 while rotating the solder bump 3 in reflow soldering.

After the flux application has been completed, "Solder Bump Mounting" indicated in FIG. 11 is performed. That is, the solder bump 3 is formed over the Au film 2k that has been formed over the relocation wiring 2e. In the solder bump mounting, the solder bump 3 is mounted onto each of the predetermined plurality of Au films 2k by using the ball mounting machine, similarly to the First Embodiment.

After the solder bump mounting has been completed, "Reflow Soldering" indicated in FIG. 11 is performed. In the reflow soldering, the temperature of the solder bump 3 is raised in the reflow furnace under the reflow soldering conditions similarly to the First Embodiment. For example, the solder bump 3 is heated at the temperature from about 200° C. to about 300° C. that are the solder melting temperatures (the solder activation temperatures).

Thereby, the activator in the flux material is heated to make it possible to remove the oxide and/or the oxide film formed over the surface of the Au film 2k. Further, as mentioned above, it is also possible to remove the oxide and/or the oxide film formed over the surface of the solder bump 3 by rotating the solder bump 3.

After the reflow soldering indicated in FIG. 11 has been completed, "Cleaning" is performed. In the cleaning, as one example, similarly to the First Embodiment, the flux material is washed out by spraying the surfactant to the semiconductor wafer 1 while rotating the semiconductor wafer 1 by spin cleaning. However, the cleaning is not limited to the spin cleaning and may be of the type that the semiconductor wafer 1 is cleaned by soaking it in the liquid tank that contains the surfactant.

Then, after the cleaning with the surfactant has been completed, the flux material is washed out by spraying pure water (spin cleaning) to the semiconductor wafer 1 similarly to the First Embodiment. However, also cleaning with pure water is not limited to spin cleaning and may be of the type that the flux material is washed out by cleaning the semiconductor wafer 1 in a state of being soaked in the tank.

From the above, the solder bump mounting indicated in FIG. 11 is completed.

After the solder bump mounting has been completed, "Back Grinding" indicated in FIG. 11 is performed in the Second Embodiment. That is, after the solder bump 3 has been formed (mounted) over the Au film 2k formed over the relocation wiring 2e, the back surface 1b that is opposite to the principal surface 1a of the semiconductor wafer 1 is ground.

Here, in the Second Embodiment, the reason why the back grinding is performed after the acid cleaning (the bump mounting pretreatment) that is the reduction treatment and the solder bump mounting have been completed will be described.

That is, each of the processes illustrated in FIG. 3 and FIG. 4 is a pre-process in the semiconductor manufacturing process and since the semiconductor wafer 1 that has been back-ground is thin and hence has such a disadvantage that it readily cracks in transportation, it is regarded to be difficult for each manufacturing equipment used in each preprocess to handle the semiconductor wafer 1 so back-ground. Further, although in the acid cleaning, the acids such as hydrochloric acid, sulfuric acid and so forth are used, since in the pre-process, hydrochloric acid, sulfuric acid and so forth are used in treatment in comparison with a post-process and an environment that the acids are handled with ease is well arranged.

Thus, in the Second Embodiment, the acid cleaning (the bump mounting pretreatment) that is the reduction treatment is performed in the pre-process before performing the back grinding and the back grinding is performed in the post-process after the solder bump mounting has been completed.

In a case where the back grinding is performed after completion of the solder bump mounting, it is unavoidable to hold a bump mounting surface of the semiconductor wafer 1, and therefore the BG tape that is made thick in adhesion layer that allows absorption of the height of the bump is stuck to the bump mounting surface and the back grinding is performed in a state where each solder bump 3 is being protected by the BG tape the adhesion layer of which is made thick.

That is, the BG tape the adhesion layer of which is made thick is stuck to the bump mounting surface (the principal surface la) of the semiconductor wafer 1 so as to absorb the height of the bump with the thickness of the adhesion layer and the back grinding is performed in a state of holding the bump mounting surface.

From the above, when the acid cleaning is to be performed, it is possible to handle the semiconductor wafer 1 even in the pre-process because the semiconductor wafer 1 is not yet back-ground and the thickness thereof is still in a thick state. In addition, since the environment that hydrochloric acid, sulfuric acid and so forth are used is well arranged, it is possible to perform the acid cleaning by using existing equipment.

In addition, it is possible to perform the back grinding even in the post-process by using the BG tape the adhesion layer of which is made thick.

However, although the acid cleaning may be performed in the post-process, it is more preferable to perform the acid cleaning in the pre-process for the above-mentioned reasons.

Thereby, the back grinding of the semiconductor wafer 1 is completed.

After the back grinding has been completed, "Dicing" illustrated in FIG. 7 is performed to cut out the respective semiconductor chips 2 from the semiconductor wafer 1.

Then, segmentation is performed by the dicing and assembly of the wafer process package 5 illustrated in FIG. 1 is completed.

According to the manufacturing method for semiconductor devices according to the Second Embodiment, before the solder bump 3 is bonded to (formed over) the Au film 2k formed over the relocation wiring 2e, it is possible to remove the oxide and/or the oxide film formed over the surface of the Au film 2k by performing the acid cleaning on the surface of the Au film 2k as the reduction treatment (the bump mounting pretreatment).

Thereby, similarly to the First Embodiment, it is possible to promote the growth of the solder bonded interface (the Sn—Ni—Cu alloy layer (the reaction layer 7 illustrated in FIG. 10)) when the solder bump bonding is performed and it is possible to suppress generation of cracks in flip-chip bonding.

As a result, it is possible to improve the bonding reliability in flip-chip bonding of the wafer process package 5.

In addition, in the Second Embodiment, as the reduction treatment, only the acid cleaning is performed and the reflow soldering is not performed. Therefore, it is possible to reduce exertion of heat stress to the semiconductor wafer 1 caused by heating for reflow soldering and it is possible to suppress a failure caused by the heat stress such as a fault that the cracks grow, for example, in flip-chip mounting of the wafer process package 5.

Further, since the acid cleaning in the Second Embodiment is simple in cleaning process in comparison with other cleaning methods, it is possible to promote a reduction in cost for cleaning.

Modified Examples

Although, in the foregoing, the invention made by the inventors and others of the present invention has been specifically described on the basis of the preferred embodiments, it goes without saying that the present invention is not limited to the aforementioned embodiments and maybe modified in a variety of ways within the scope not deviating from the gist of the present invention.

Modified Example 1

Although in the above-mentioned embodiments 1 and 2, a case where the semiconductor device is the wafer process package has been described, the semiconductor device may be another semiconductor package as long as it is the package that includes the relocation wiring and the Ni/Au film formed over the relocation wiring.

Modified Example 2

Further, application of modified examples is possible by mutually combining them within the scope not deviating from the gist of the technical idea described in the embodiments.

What is claimed is:

1. A manufacturing method for semiconductor devices, comprising the steps of:
    (a) forming an Ni/Au film that includes an Ni film and an Au film formed over the Ni film over a wiring that is coupled to each of a plurality of electrode pads formed over a principal surface of a semiconductor wafer and arranges each of the electrode pads at a different position;
    (b) after the step (a), performing reduction treatment on a surface of the Ni/Au film; and
    (c) after the step (b), forming a solder bump over the Ni/Au film.

2. The manufacturing method for semiconductor devices according to claim 1,
    wherein the reduction treatment includes the steps of,
    (b1) applying a flux constituent material,
    (b2) after the step (b1), performing reflow soldering, and
    (b3) after the step (b2), performing cleaning.

3. The manufacturing method for semiconductor devices according to claim 2,
    wherein as the flux constituent material, a material that is the same as that of a flux material that is applied to the Au film after the reduction treatment has been performed and before the solder bump is formed.

4. The manufacturing method for semiconductor devices according to claim 2,
    wherein before the solder bump is formed, a back surface that is opposite to the principal surface of the semiconductor wafer is ground.

5. The manufacturing method for semiconductor devices according to claim 1,
    wherein the step (c) includes the steps of,
    after the solder bump has been mounted over the Au film,
    (c1) performing reflow soldering, and
    (c2) performing cleaning.

6. The manufacturing method for semiconductor devices according to claim 1,
    wherein the reduction treatment is acid cleaning.

7. The manufacturing method for semiconductor devices according to claim 6,
    wherein after the solder bump has been formed, a back surface that is opposite to the principal surface of the semiconductor wafer is ground.

8. The manufacturing method for semiconductor devices according to claim 6, wherein an acid used in the acid cleaning is hydrochloric acid, sulfuric acid and so forth.

9. The manufacturing method for semiconductor devices according to claim 1,
wherein the Au film is formed by electroless plating.

10. The manufacturing method for semiconductor devices according to claim 9,
wherein the electroless plating is displacement plating.

11. The manufacturing method for semiconductor devices according to claim 1,
wherein the Au film is exposed into an opening in an insulating film that has been formed over the wiring.

12. The manufacturing method for semiconductor devices according to claim 1,
wherein the electrode pad includes Al and so forth, the wiring is a wiring that includes Cu as a principal component, and the wiring is electrically coupled with the electrode pad via a Cr film.

* * * * *